(12) United States Patent
Smith

(10) Patent No.: US 6,777,278 B2
(45) Date of Patent: Aug. 17, 2004

(54) METHODS OF FABRICATING ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT

(75) Inventor: Richard Peter Smith, Carrboro, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/374,438

(22) Filed: Feb. 25, 2003

(65) Prior Publication Data

US 2003/0157776 A1 Aug. 21, 2003

Related U.S. Application Data

(62) Division of application No. 09/904,333, filed on Jul. 12, 2001, now Pat. No. 6,548,333.
(60) Provisional application No. 60/250,755, filed on Dec. 1, 2000.

(51) Int. Cl.[7] .............................................. H01L 21/338
(52) U.S. Cl. ......................... 438/172; 438/180; 438/182
(58) Field of Search ................................ 438/168, 172, 438/180, 182; 257/192, 194

(56) References Cited

U.S. PATENT DOCUMENTS

| | | | |
|---|---|---|---|
| 4,424,525 A | | 1/1984 | Mimura ........................ 357/23 |
| 4,471,366 A | | 9/1984 | Delagebeaudeuf et al. ... 357/16 |
| 4,727,403 A | | 2/1988 | Hida et al. ..................... 357/22 |
| 4,788,156 A | * | 11/1988 | Stoneham et al. ........... 438/167 |
| 5,192,987 A | | 3/1993 | Khan et al. ............... 257/183.1 |
| 5,296,395 A | | 3/1994 | Khan et al. .................... 437/40 |
| 5,701,019 A | | 12/1997 | Matsumoto et al. ......... 257/192 |
| 5,705,827 A | | 1/1998 | Baba et al. .................... 257/46 |
| 5,885,860 A | * | 3/1999 | Weitzel et al. ............... 438/179 |

(List continued on next page.)

FOREIGN PATENT DOCUMENTS

| | | |
|---|---|---|
| EP | 0 563 847 A2 | 10/1993 |
| JP | 10-050982 | 2/1998 |
| JP | 2001230407 A | 8/2001 |
| JP | 2002016087 | 1/2002 |
| WO | WO 93/23877 | 11/1993 |
| WO | WO 03/049193 A1 | 6/2003 |

OTHER PUBLICATIONS

P.M. Asbeek et al. "Piezoelectric charge densities in AlGaN GaN HFETs," *Electronics Letters*. vol. 33, No. 14, pp. 1230–1231, 1997.

(List continued on next page.)

*Primary Examiner*—T. N. Quach
(74) *Attorney, Agent, or Firm*—Myers Bigel Sibley & Sajovec, P.A.

(57) ABSTRACT

High electron mobility transistors (HEMTs) and methods of fabricating HEMTs are provided Devices according to embodiments of the present invention include a gallium nitride (GaN) channel layer and an aluminum gallium nitride (AlGaN) barrier layer on the channel layer. A first ohmic contact is provided on the barrier layer-to provide a source electrode and a second ohmic contact is also provided on the barrier layer and is spaced apart from the source electrode to provide a drain electrode. A GaN-based cap segment is provided on the barrier layer between the source electrode and the drain electrode. The GaN-based cap segment has a first sidewall adjacent and spaced apart from the source electrode and may have a second sidewall adjacent and spaced apart from the drain electrode. A non-ohmic contact is provided on the GaN-based cap segment to provide a gate contact. The gate contact has a first sidewall which is substantially aligned with the first sidewall of the GaN-based cap segment. The gate contact extends only a portion of a distance between the first sidewall and the second sidewall of the GaN-based cap segment.

20 Claims, 6 Drawing Sheets

U.S. PATENT DOCUMENTS

| | | | |
|---|---|---|---|
| 6,028,328 | A | 2/2000 | Riechert et al. ............ 257/194 |
| 6,046,464 | A | 4/2000 | Schetzina .................... 257/96 |
| 6,064,082 | A | 5/2000 | Kawai et al. ................ 257/192 |
| 6,177,685 | B1 | 1/2001 | Teraguchi et al. ............ 257/20 |
| 6,316,793 | B1 * | 11/2001 | Sheppard et al. ........... 257/103 |
| 6,429,467 | B1 | 8/2002 | Ando .......................... 257/194 |
| 6,448,648 | B1 | 9/2002 | Boos .......................... 257/751 |
| 6,515,316 | B1 | 2/2003 | Wojtowicz et al. ......... 257/194 |
| 6,639,255 | B2 * | 10/2003 | Inoue et al. ................ 257/194 |
| 2001/0015446 | A1 | 8/2001 | Inoue et al. ................ 257/192 |
| 2001/0020700 | A1 | 9/2001 | Inoue et al. .................. 257/20 |
| 2001/0023964 | A1 | 9/2001 | Wu et al. .................... 257/368 |
| 2002/0017696 | A1 | 2/2002 | Nakayama et al. ......... 257/471 |
| 2003/0102482 | A1 | 6/2003 | Saxler ......................... 257/85 |

OTHER PUBLICATIONS

Yu et al. "Schottky barrier engineering in III–V nitrides via the piezoelectric effect," *Applied Physics Letters*, vol. 73, No. 13, pp. 1880–1882, Sep. 28, 1998.

Gaska et al. "High–Temperature Performance of AlGaN GaN HFET's on SiC Substrates," *IEEE Electron Device Letters*. vol. 18, No. 1, p. 492, Oct. 1997.

Ping et al. "DC and Microwave Performance of High–Current AlGaN GaN Heterostructure Field Effect Transistors Grown on P–Type SiC Substrates," *IEEE Electron Letters*. vol. 19, No. 2, p. 54, Feb. 1998.

Chu et al. "GaN materials for high power microwave amplifiers," *Mat. Res. Soc. Symp Proc.* vol. 512 (1998).

G. Sullivan et al. "High–Power to GHz Operation at AlGaN HFET's in Insulating Sic," *IEEE Electron Device Letters* vol. 19, No. 6, p. 198, Jun. 1998.

Wu et al "High Al–Content AlGaN–GaN MODFFI's for Ultrahigh Performance," *IEEE Electron Device Letters* vol. 19, No. 2, p. 50, Feb. 1998.

Sheppard et al U.S. patent application Ser. No. 09/096,967 entitled. Nitride Based Transistors On Semi–Insulating Silicon Carbide Substrates, filed Jun. 12, 1998.

Sheppard et al. "High Power Demonstration at 10 GHz with GaN AlGaN HEMT Hybrid Amplifiers." Presented at the 58$^{th}$ DRC. Denver. CO, Jun. 2000.

Sheppard et al. "Improved 10 GHz Operation of GaN AlGaN HEMT's on Silicon Carbide," *Materials Science Forum.* (*2000*) vols. 338–342, pp. 1643–1646.

Fastman et al "Undoped AlGaN GaN HEMT's for Microwave Power Amplification." *IEEE Transactions on Electron Devices*. vol. 48, No. 3, Mar. 2001. pp. 479–485.

Copy of International Search Report for PCT US02 09398, Aug. 26, 2002.

Heikman et al., "Polarization Effects in A1GaN/GaN and GaN/A1GaN/GaN hetrostructures", Journal of Applied Physics, vol. 93, No. 12, Jun. 15, 2003, pp. 10114–10118.

Karmalkar et al., "Resurf A1GaN/GaN HEMT for High Voltage Power Switching", *IEEE Electron Device Letters*, vol. 22, No. 8, Aug. 2001, pp. 373–375.

Wu et al., "30–W/mm A 1GaN/GaN HEMTs by Field Plate Optimization", *IEEE Electron Device Letters*, Published 2004.

* cited by examiner

METHODS OF FABRICATING ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT

The present application is a divisional of and claims priority from Application No. 09/904,333, filed Jul. 12, 2001 (now U.S. Pat. No. 6,548,333), entitled Aluminum Gallium Nitride/Gallium Nitride High Electron Mobility Transistors Having A Gate Contact On A Gallium Nitride Based Cap Segment And Methods Of Fabricating Same assigned to the assignee of the present application which is related to and claims priority from U.S. Provisional Application Serial No. 60/250,755, filed Dec. 1, 2000 and entitled "AlGaN/GaN HEMT with Improved Gate Barrier Layer and Low Access Resistance," the disclosures of which are incorporated herein as if set forth fully herein.

STATEMENT OF GOVERNMENT INTEREST

The present invention was developed, at least in part, under Office of Naval Research Contract No. N00014-99-C-0657. The Government has certain rights in this invention.

FIELD OF THE INVENTION

The present invention relates to High Electron Mobility Transistor (HEMT) and more particularly to aluminum gallium nitride (AlGaN)/gallium nitride (GaN) HEMTs.

BACKGROUND OF THE INVENTION

AlGaN/GaN HEMT (High Electron Mobility Transistor) devices are well known in the semiconductor field. U.S. Pat. Nos. 5,192,987 and 5,296,395 describe AlGaN/GaN HEMT structures and methods of manufacture. Improved HEMT structures are disclosed in commonly assigned U.S. patent application Ser. No. 09/096,967 filed Jun. 12, 1998 now U.S. Pat. No. 6,316,793 and entitled "NITRIDE BASED TRANSISTORS ON SEMI-INSULATING SILICON CARBIDE SUBSTRATES" which is incorporated by reference in its entirety.

A typical AlGaN/GaN HEMT structure 110 is illustrated in FIG. 1. A GaN channel layer 114 is formed on buffer layer 113 on a substrate 112. An AlGaN barrier layer 116 is formed on the GaN channel layer 114. A source electrode 118 and a drain electrode 120 form ohmic contacts through the surface of the AlGaN layer 116 to the electron layer that is present at the top of the GaN channel layer 114. In a conventional AlGaN/GaN HEMT, a gate electrode 122 forms a non-ohmic contact to the surface of the AlGaN layer 116.

Because of the presence of aluminum in the crystal lattice, AlGaN has a wider bandgap than GaN. Thus, the interface between the GaN channel layer 114 and the AlGaN barrier layer 116 forms a heterostructure. FIG. 2 is a band diagram showing the energy levels in the device along a portion of section I-I' of FIG. 1. As illustrated in FIG. 2, the conduction and valence bands Ec and Ev in the AlGaN barrier layer 116 are distorted due to polarization effects. Consequently, a two dimensional electron gas (2DEG) sheet charge region 115 is induced at the heterojunction between the GaN channel layer 114 and the AlGaN barrier layer 116, while the AlGaN barrier layer 116 is depleted of mobile carriers due to the shape of the conduction band. As shown in FIG. 2, the conduction band Ec dips below the Fermi level (Ef) in the area of the GaN channel layer 114 that is immediately adjacent to AlGaN barrier layer 116.

Electrons in the 2DEG sheet charge region 115 demonstrate high carrier mobility. The conductivity of this region is modulated by applying a voltage to the gate electrode 122. When a reverse voltage is applied, the conduction band in the vicinity of the sheet charge region 115 is elevated above the Fermi level, and a portion of the sheet charge region 115 is depleted of carriers, thereby preventing the flow of current from source 118 to drain 120.

As illustrated in FIG. 1, AlGaN/GaN HEMTs have typically been fabricated with coplanar metal contacts. That is, the ohmic contacts for the source 118 and drain 120 electrodes are on the same epitaxial layer (namely, the AlGaN layer 116) as the gate electrode 122. Given that ohmic contacts are intended to provide low resistance, non-rectifying contacts to a material, while the gate contact is intended to be a non-ohmic contact that blocks current at large reverse voltages, forming all three contacts on the same epitaxial layer may result in compromises between these characteristics. Stated another way, in a conventional AlGaN/GaN HEMT device, there is a tradeoff in device design when selecting the doping and composition of the AlGaN barrier layer 116 between optimizing the source and drain ohmic contacts on one hand and optimizing the non-ohmic gate contact on the other hand.

In addition, consideration should be given to providing as much current-carrying capability as possible to the sheet charge region 115 under the gate electrode 122, again, while allowing the gate to block at as high a voltage as possible. Thus, it may be advantageous to have differences in the regions between the source and gate, under the gate, and between the gate and drain in order to modify the amount of band-bending and, thus, the amount of charge. Modifying band-bending will change the amount of charge in the sheet charge region 115 as well as the electric fields present within the device.

In conventional Gallium Arsenide (GaAs) and Indium Phosphorous (InP-based) HEMT devices, an additional GaAs or Indium Gallium Arsenide (InGaAs) layer is formed on the surface of the barrier layer. Source and drain contacts are made to the additional layer, while the gate electrode is recessed down to the barrier layer. This approach, however, may not be suitable for AlGaN/GaN HEMT structures, because the top surface of GaN is generally not conductive, and there is no benefit to recessing the gate down to the barrier layer.

Thus, there is the need in the art for improvements in AlGaN/GaN HEMT structures and methods of fabricating AlGaN/GaN HEMTs.

SUMMARY OF THE INVENTION

Embodiments of the present invention provide high electron mobility transistors (HEMTs) and methods of fabricating HEMTs. Devices according to embodiments of the present invention include a gallium nitride (GaN) channel layer and an aluminum gallium nitride (AlGaN) barrier layer on the channel layer. A first ohmic contact is provided on the barrier layer to provide a source electrode and a second ohmic contact is also provided on the barrier layer and is spaced apart from the source electrode to provide a drain electrode. A cap segment is provided on the barrier layer between the source electrode and the drain electrode. The cap segment has a first sidewall adjacent and spaced apart from the source electrode. The cap segment may also have a second sidewall adjacent and spaced apart from the drain electrode. A non-ohmic contact is provided on the cap segment to provide a gate contact. The gate contact has a first sidewall which is substantially aligned with the first sidewall of the cap segment. The gate contact extends only a portion of the distance between the first sidewall and the second sidewall of the cap segment. In particular embodiments, the cap segment is a GaN cap segment.

In further embodiments of the present invention, the non-ohmic contact extends to, but not past, the first sidewall of the GaN cap segment. The GaN cap segment may have a thickness of from about 10 to about 60 Å. The GaN cap segment may also be undoped GaN.

In particular embodiments of the present invention, the source electrode and the drain electrode are spaced apart a distance of from about 2 to about 4 $\mu$m. Furthermore, the first sidewall of the GaN cap segment is preferably as close a possible and may, for example, be from about 0 to about 2 $\mu$m from the source electrode. The second sidewall of the GaN cap segment may be from about 0.5 to about 1 $\mu$m from the gate electrode.

In additional embodiments of the present invention, the AlGaN barrier layer is between about 15% and about 40% aluminum. The AlGaN barrier layer may also be doped with silicon at a concentration of up to about $4\times10^{18}$ cm$^{31\ 3}$ or higher an preferably provides a total sheet concentration of up to about $5\times10^{12}$ cm$^{-2}$ and may have a thickness of from about 15 to about 40 nm and, preferably, about 25 nm.

In still further embodiments of the present invention, the GaN channel layer is provided on a substrate. The substrate may be silicon carbide, sapphire or the like. In particular embodiments, the substrate is 4H silicon carbide or 6H silicon carbide. Furthermore, a GaN buffer layer may be disposed between the GaN channel layer and the substrate.

In yet additional embodiments of the present invention, the gate electrode is a T-shaped gate electrode.

In method embodiments of the present invention, methods of fabricating a high electron mobility transistor (HEMT) is provided by forming a first gallium nitride (GaN) layer on a substrate, forming an aluminum gallium nitride (AlGaN) layer on the first GaN layer. A second GaN layer is patterned on the AlGaN layer to provide a GaN segment on the AlGaN layer and to expose portions of the AlGaN layer. A first ohmic contact is formed to the AlGaN layer adjacent and spaced apart from the GaN segment to provide a source electrode and a second ohmic contact is formed to the AlGaN layer adjacent and spaced apart from the GaN segment and opposite first ohmic contact such that the GaN segment is disposed between the first ohmic contact and the second ohmic contact to provide a drain electrode. A non-ohmic contact is patterned on the GaN segment to provide a gate contact. The gate contact has a first sidewall which is substantially aligned with the a first sidewall of the GaN segment adjacent the source contact. The gate contact extends only a portion of the distance between the first sidewall and a second sidewall of the GaN segment adjacent the drain contact.

In further embodiments of the present invention, the patterning of the second GaN layer and the patterning the non-ohmic contact may be provided by forming a second GaN layer on the AlGaN layer, forming a non-ohmic contact on the second GaN layer and patterning the non-ohmic contact and the second GaN layer to provide the GaN segment and the gate contact. Such patterning may further be provided by forming a mask that covers portions of the non-ohmic contact and the second GaN layer so as to define a sidewall of the non-ohmic contact and the GaN segment adjacent the source contact and a sidewall of the GaN segment adjacent the drain contact and etching the non-ohmic contact and the second GaN layer to expose portions of the AlGaN layer.

DETAILED DESCRIPTION OF THE INVENTION

Figure 1:
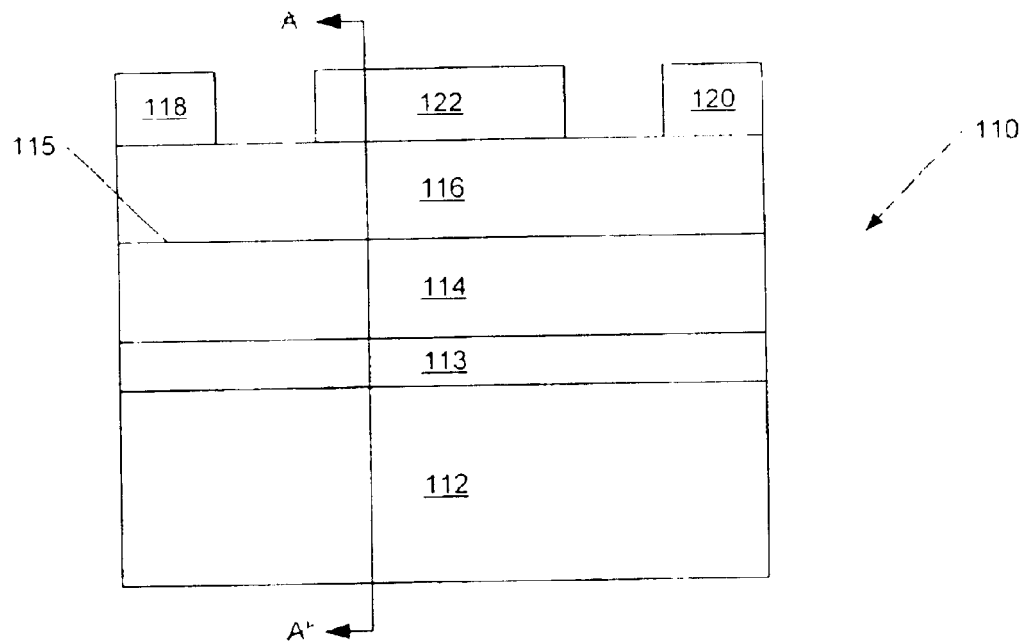
FIG. 1 is a cross sectional illustration of a conventional AlGaN/GaN HEMT device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As illustrated in the Figures, the sizes of layers or regions are exaggerated for illustrative purposes and, thus, are provided to illustrate the general structures or the present invention. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

As described above, it is well known that large electron concentrations may appear at buried AlGaN/GaN interfaces under equilibrium conditions. These large electron concentrations may form a high carrier mobility two-dimensional electron gas (2DEG) which may be advantageously exploited in a HEMT device structure. Moreover, the addition of a GaN cap on the AlGaN barrier layer of such a structure can increase the size of the barrier to electron conduction to or from the top surface of the structure. However, the presence of the GaN cap may decrease the electron concentration in the 2DEG conduction layer assuming that the surface potential is the same in both cases (i.e. with or without the cap).

Although it has been suggested by Yu et al. that HEMT's may be fabricated on GaN/AlGaN/GaN structures, the improvement in gate performance in such a structure appears to be offset by increases in channel resistance due to lower carrier concentration in the conduction layer under the GaN cap. See E. T. Yu, et al., "Schottky barrier engineering in III–V nitrides via the piezoelectric effect," Appl. Phys. Lett. 73, 1880 (1998).

Embodiments of the present invention provide improved AlGaN/GaN HEMT devices and methods of fabricating such devices. In particular embodiments of the present invention, the trade-offs between low-resistance source and drain contacts, current flow through the device, and blocking capability of the gate contact may be reduced or avoided by providing a GaN cap segment on the AlGaN barrier layer and providing a non-ohmic contact on the cap segment to provide the gate contact. In further embodiments, the gate contact and cap segment are arranged so as to provide an AlGaN/GaN HEMT structure with reduced internal electric fields, which may result in higher operating voltages and power levels. Thus, embodiments of the present invention may provide the benefits of low contact resistance found in AlGaN/GaN HEMT structures with the gate performance improvements associated with GaN/AlGaN/GaN structures.

Figure 3:
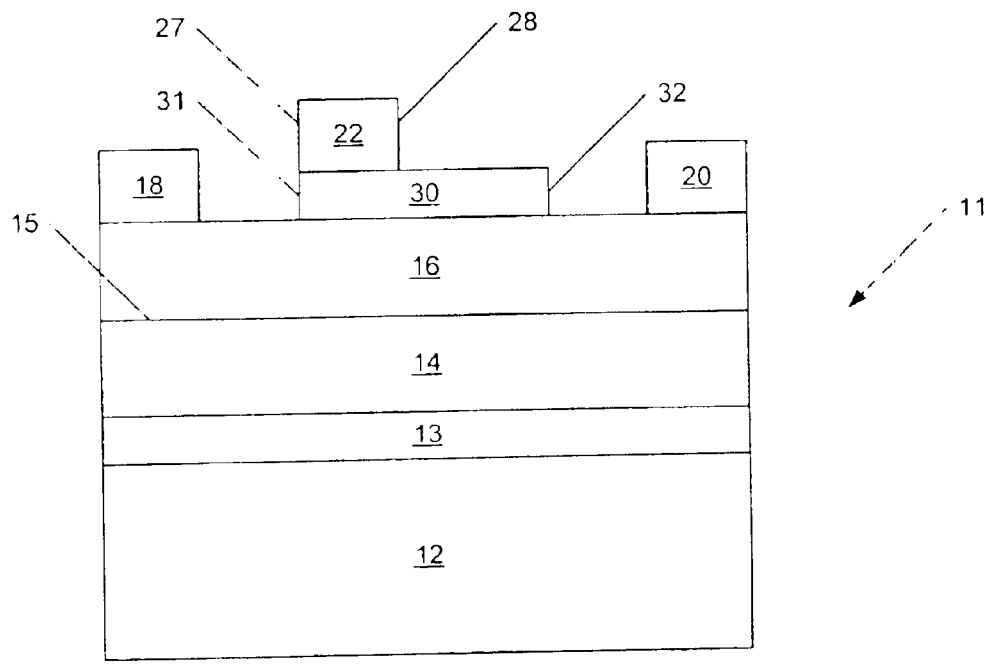
FIG. 3 is a cross sectional illustration of an AlGaN/GaN HEMT device according to embodiments of the present invention.
Figure 2:
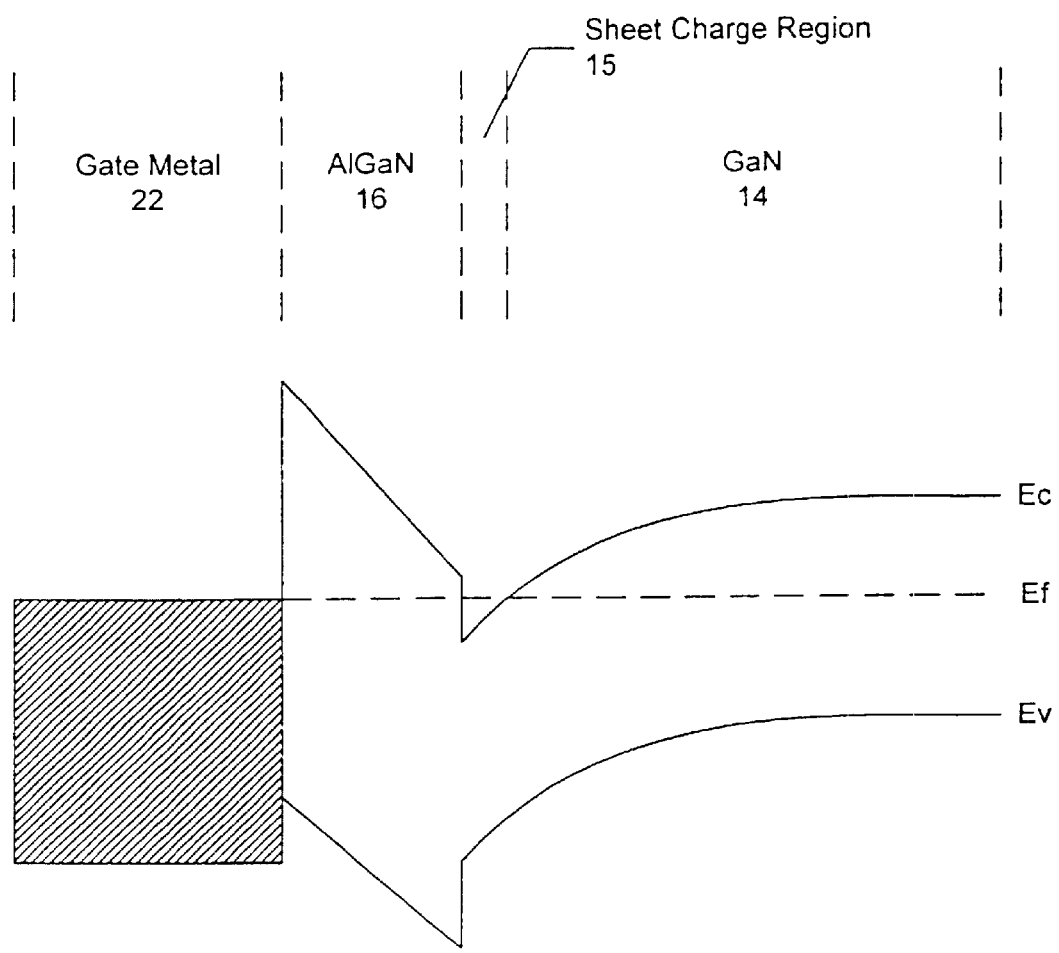
FIG. 2 is a schematic illustration of the band energies present in a conventional AlGaN/GaN HEMT device.

FIG. 3 illustrates a device 11 according to embodiments of the present invention. The device 11 includes a substrate 12 and an optional buffer layer 13 on the substrate 12. The substrate 12 may be silicon carbide, sapphire, silicon, bulk gallium nitride or any other suitable substrate for supporting nitride-based electronic devices. Preferably, the substrate is semi-insulating 4H-silicon carbide (0001) or 6H-SiC (0001). For substrates other than bulk GaN, the optional buffer layer 13 provides a surface on which high-quality gallium nitride may be grown. The composition and fabrication of the buffer layer 13 may depend on the type of substrate used. Suitable buffer layers are well known in the art and need not be described further. A GaN channel layer 14 is also provided on the buffer layer 13 if the buffer layer 13 is present or on the substrate 12 if the buffer layer 13 is not present. The channel layer 14 and subsequent GaN-based layers may be formed by MOCVD, MBE, and/or any other suitable growth technique. The channel layer 14 is preferably undoped, but may be doped with various substances in order to modify the electron concentration in the sheet charge region 15 or the behavior of the conduction band Ec and valence band Ev in the area below the sheet charge region.

An AlGaN barrier layer 16 is provided on the GaN channel layer 14, thereby forming a heterojunction 15 between the channel layer 14 and the barrier layer 16. The AlGaN barrier layer 16 preferably has an aluminum composition of between 15% and 60% and may be doped with silicon at a doping concentration of up to about $4 \times 10^{18}$ cm$^{-3}$ to provide a total sheet concentration of up to about $5 \times 10^{12}$ cm$^{-2}$ or more. The barrier layer 16 may be between about 15 nm and 40 nm in thickness, and is preferably about 25 nm thick.

As described above, because of the AlGaN/GaN heterobarrier at the junction 15, a two dimensional electron gas is formed within the vicinity of the junction 15. Ohmic source 18 and drain 20 electrodes are provided on the surface of the AlGaN barrier layer 16. Source 18 and drain 20 electrodes may be Ti/Si/Ni, Ti/Al/Ni or any other suitable material that forms an ohmic contact to n-type AlGaN. Appropriate ohmic contacts for AlGaN/GaN HEMT devices are described in S. T. Sheppard, W. L. Pribble, D. T. Emerson, Z. Ring, R. P. Smith, S. T. Allen and J. W. Palmour, "High Power Demonstration at 10 GHz with GaN/AlGaN HEMT Hybrid Amplifiers," Presented at the 58th Device Research Conference, Denver, Colo. June 2000, and S. T. Sheppard, K. Doverspike, M. Leonard, W. L. Pribble, S. T. Allen and J. W. Palmour, "Improved 10-GHz Operation of GaN/AlGaN HEMTs on Silicon Carbide," Mat. Sci. Forum, Vols. 338–342 (2000), pp. 1643–1646, the disclosures of which are incorporated herein by reference as if set forth fully herein. The distance between the source electrode 18 and the drain electrode 20 may, typically, be from about 2–4 μm.

As is further illustrated in FIG. 3, a thin GaN-based cap segment 30, preferably of GaN, is provided on the surface of the AlGaN layer 16 between the source electrode 18 and the drain electrode 20. The cap segment 30 is preferably between about 10–60 Å in thickness, and is preferably undoped. The cap segment 30 is preferably formed of gallium nitride, however, other suitable materials may also be utilized. For example, a graded or reduced aluminum content AlGaN layer may be utilized such that the percentage of aluminum decreases with distance from the channel layer. Such an AlGaN layer could be formed, for example, by etching, to provide the cap segment 30. As used herein, the term GaN-based refers to a material having gallium and nitrogen and includes GaN and AlGaN.

The gate electrode 26 is provided on the cap segment 30. The gate electrode 26 is preferably formed of platinum, nickel or any other suitable metal that forms a non-ohmic contact to n-type or "intrinsic" GaN. The gate electrode 26 may be capped with an additional metal layer in a T-shaped gate configuration, or, in particular embodiments, a T-shaped gate may be formed in one process step. A T-shaped gate configuration may be particularly suitable for RF and microwave devices.

Because of the polarization effects in GaN/AlGaN structures grown on the gallium or aluminum face of AlGaN or GaN, the barrier to conduction under the gate electrode 22 is greatly enhanced. Thus, gate leakage may be reduced or even minimized.

Preferably, the source-side sidewall 31 of the cap segment 30 is substantially aligned to the source-side sidewall 27 of the gate electrode 26. Since the presence of the cap segment 30 may reduce the concentration of carriers in the 2DEG region 15 underneath it, it may be undesirable to have the cap segment 30 extend substantially between the source electrode 18 and the gate electrode 26, since that may result in increased resistance. Thus, it is preferable to have the cap segment 30 be spaced apart from the source electrode 18 as small a distance as is reasonable in light of manufacturing limitations. Thus, a distance of from about 0 to about 2 μm may be suitable, for example, distances of from about 0.3 to about 1.5 μm may possible with conventional masking and fabrication techniques. Conversely, it may be advantageous to extend the drain-side sidewall 32 of the cap segment 30 past the drain-side sidewall 28 of the gate electrode 26 for a predetermined distance, preferably from about 0.5 to about 1 μm. Thus, the drain-side sidewall 32 of the cap segment 30 may extend to a distance of from about 0 to about 3 μm from the drain electrode 20. In the event the distance from the drain-side sidewall 32 to the drain electrode 20 is 0 μm, there may be no drain-side sidewall 32 but the cap segment 30 may extend to under the drain electrode 20. However, such may not be preferred. Thus, in preferred embodiments of the present invention, the distance from the drain-sidewall 32 to the drain electrode 20 be about 0.5 μm or greater.

The presence of the cap segment 30 underneath the gate electrode 26 need not adversely affect the operation of the device, since the gate bias can be adjusted to compensate for the effect of the cap segment 30 on carrier concentration in the 2DEG region 15 under the gate. In operation, electrons flow from the source electrode 18 to the drain electrode 20 through the 2DEG region 15. While not being bound by any particular theory of operation, it is believed that the presence of the cap segment 30 over the 2DEG region between the gate electrode 22 and the drain electrode 20 does not adversely affect the operation of the device because the conductivity of the device is not dominated by the equilibrium electron concentration in the portion of the 2DEG region 15 between the gate electrode 22 and the drain electrode 20. In fact, extending the cap segment 30 past the drain-side sidewall 28 of the gate electrode 26 for a predetermined distance may improve device performance by reducing internal electric fields in the device, thus permitting operation at higher voltages and power levels. Breakdown voltages in FETs are limited by the maximum internal electric field which normally occurs on the drain-side of the gate contact and can induce avalanche and other unwanted currents through the gate. Extending the cap segment towards the drain reduces the total amount of charge under that cap that results from polarization effects. Solving Poisson's equation for such a transistor shows that a transistor with less charge in the region under the gate and towards the drain can be operated at a higher bias for a given assumed maximum permissible electric field.

While FIG. 3 illustrates embodiments of the present invention as discrete devices, as will be appreciated by those of skill in the art, FIG. 3 may be considered unit cells of devices having multiple cells. Thus, for example, additional unit cells may be incorporated into the devices illustrated in FIGS. 3 by mirroring the device about a vertical axis at the periphery of the device illustrated in FIG. 3 (the vertical edges of the devices illustrated in FIGS. 3). Accordingly, embodiments of the present invention include devices such as those illustrated in FIGS. 3 as well as devices having a plurality of unit cells incorporating the cap segment and gate contact illustrated in FIG. 3.

Figure 4A:
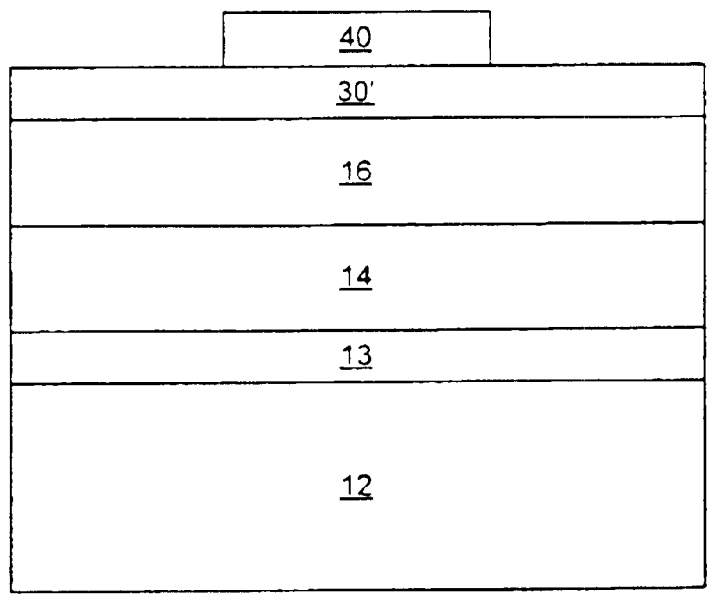
FIGS. 4A through 4C illustrate aspects of a method of fabricating a device according to embodiments of the present invention.
Figure 4B:
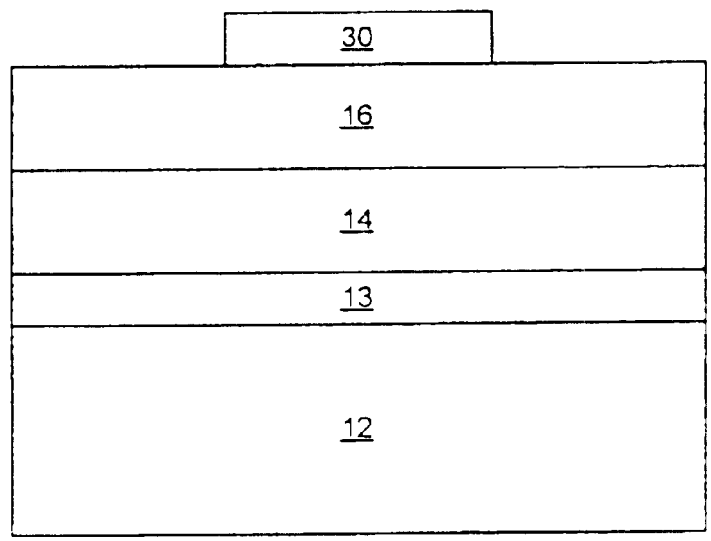
Figure 4C:
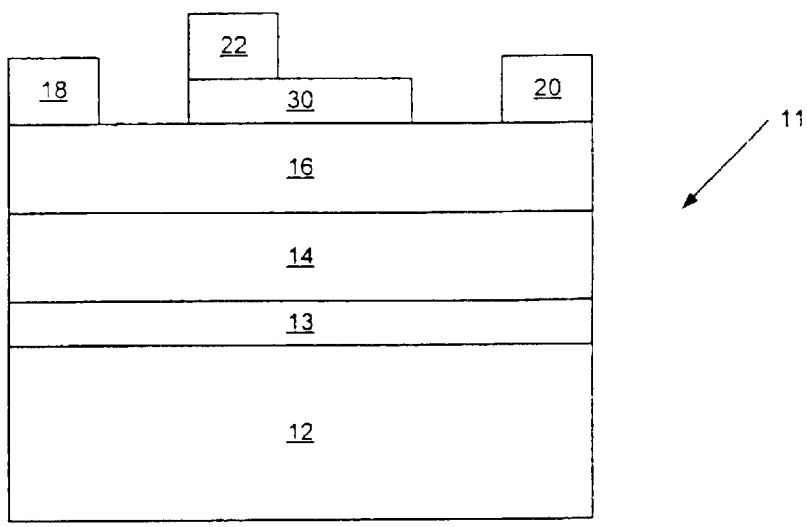

A method for manufacturing an AlGaN/GaN HEMT according to the present invention which utilizes a GaN cap segment is illustrated in FIGS. 4A through 4C and, optionally, includes forming a buffer layer 13 on a substrate 12. A GaN channel layer 14 is formed on the buffer layer 13 and an AlGaN barrier layer 16 is formed on the channel layer. A thin GaN cap layer 30' is formed on the barrier layer 16. The layers may be formed by MOCVD, MBE and/or any other suitable method known to those of skill in the art.

The GaN cap layer 30' is patterned to provide the GaN cap segment 30 for the gate electrode. For example, as illustrated in FIG. 4A, an etch mask 40 may be formed on the GaN cap layer 30', and portions of the GaN cap layer 30' removed, for example, by using a conventional etch process, to the barrier layer 16, leaving the GaN cap segment 30 as illustrated in FIG. 4B. However, other techniques, such as selective epitaxial growth may also be used.

Figure 5A:
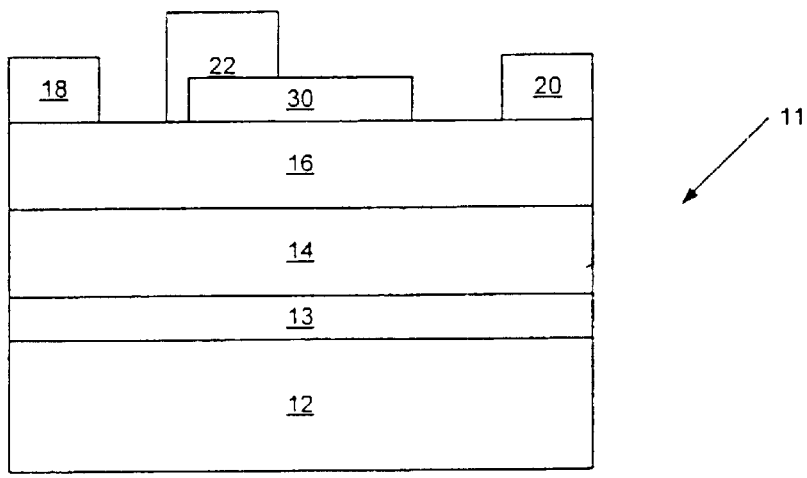
FIGS. 5A and 5B illustrate potential gate electrode misalignment.
Figure 5B:
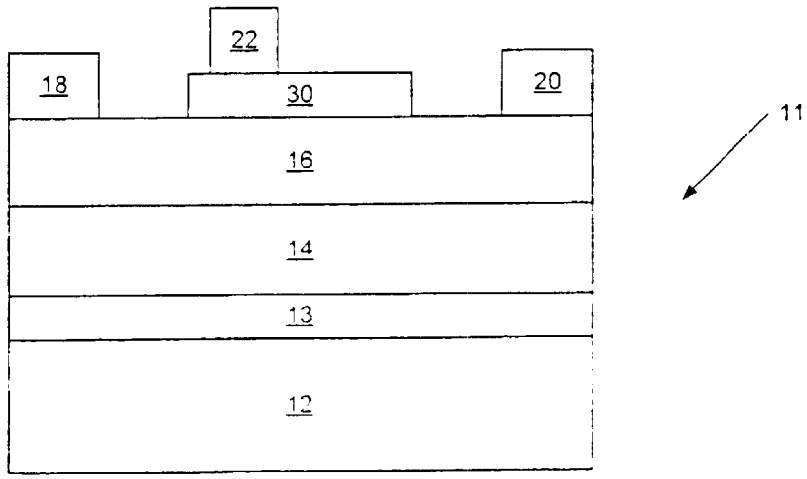

As shown in FIG. 4C, the source electrode 18 and drain electrode 20 are formed on the exposed portions of the barrier layer 16 using conventional techniques. A gate electrode 22 is formed on the GaN segment 30. In the embodiments shown in FIGS. 4A through 4C, the source-side sidewall of the gate contact is aligned with the source-side sidewall of the GaN cap segment 30 using conventional photolithographic techniques and mask alignment tools. In the embodiments illustrated in FIGS. 4A through 4C, the gate electrode 22 is not self-aligned to the source-side sidewall of the GaN cap segment 30. Therefore, it is possible that the gate electrode 22 may be misaligned to the source-side or the drain side, as shown in FIGS. 5A and 5B, respectively. Although slight misalignment may not adversely affect the operation of the device, severe misalignment may be detrimental to the device. Thus, it is preferred that the source-side sidewall of the gate electrode 22 be aligned with the source-side of the GaN cap segment 30 as illustrated in FIG. 4C, however, the source-side sidewall of the gate electrode 22 may only be substantially aligned with the source-side sidewall of the GaN cap segment 30 as illustrated in FIGS. 5A and 5B and still benefit from the teachings of the present invention. Thus, as used herein, the term substantial alignment or substantially aligned refers to a range of alignments which may include misalignment.

Figure 6A:
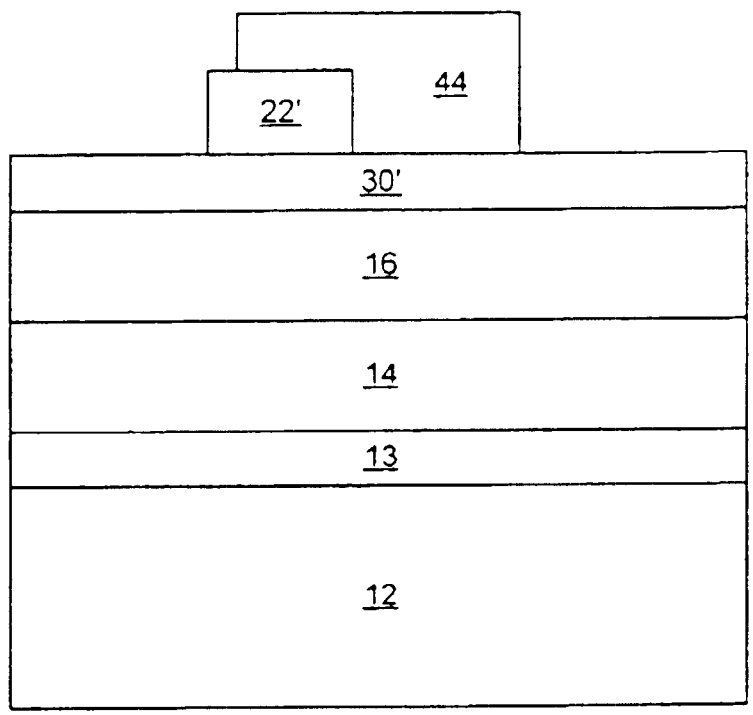
FIGS. 6A through 6C illustrate aspects of a method of fabricating a device according to additional embodiments of the present invention.
Figure 6B:
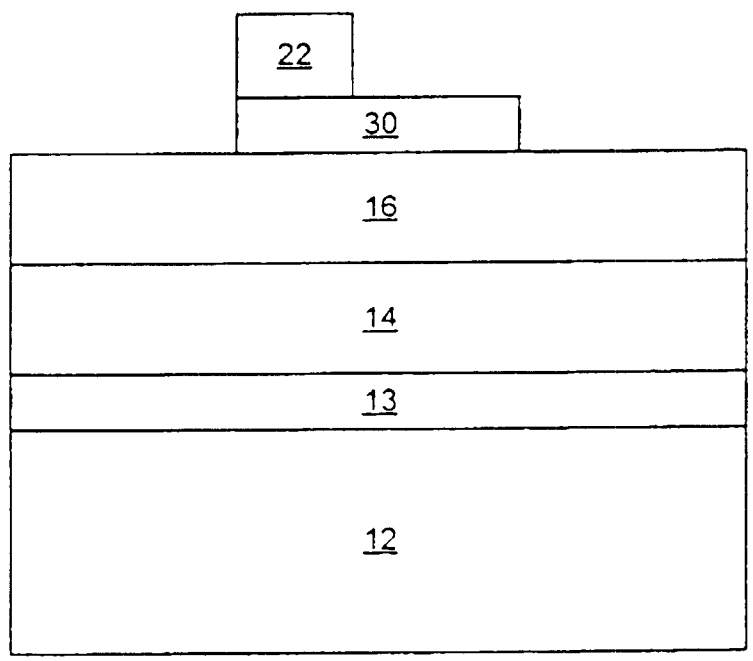
Figure 6C:
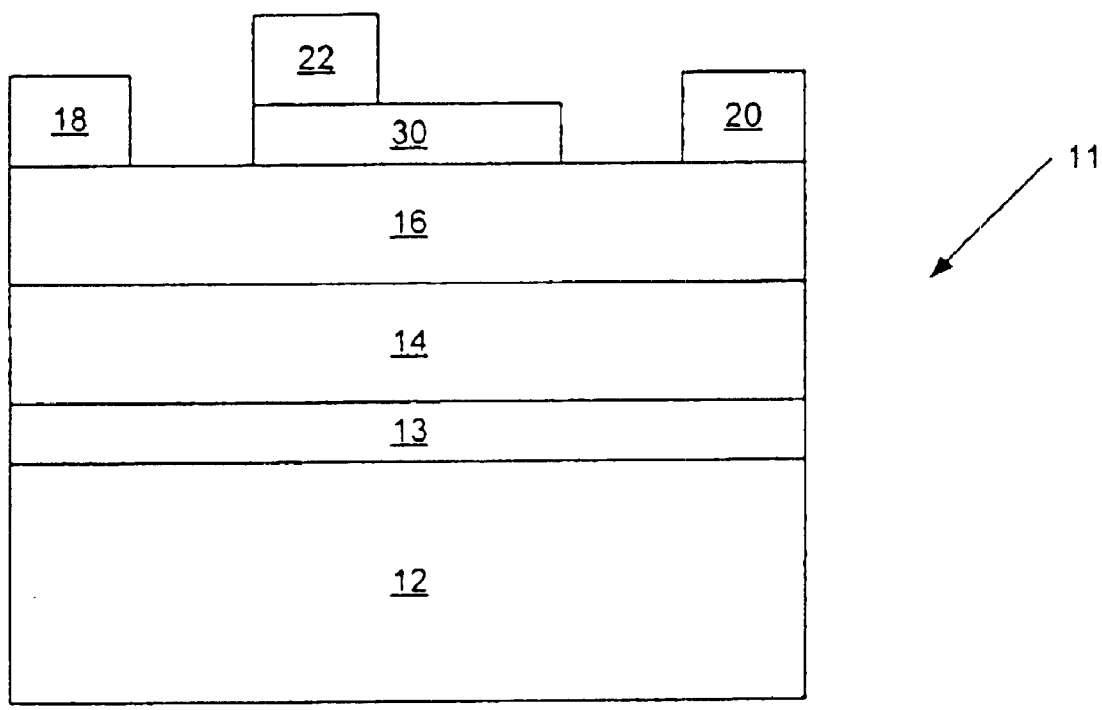

Another method for manufacturing a device according to embodiments of the present invention is illustrated in FIGS. 6A through 6C. In these embodiments, the source-side sidewall of the GaN cap segment 30 is self-aligned to the source-side sidewall of the gate electrode 22.

Referring to FIG. 6A, optionally, the buffer layer 13 is formed on a substrate 12. The GaN channel layer 14 is formed on the GaN buffer layer 13 or the substrate 12 and the AlGaN barrier layer 16 is formed on the GaN channel layer 14. The thin GaN cap layer 30' is formed on the AlGaN barrier layer 16 as described above. A gate metal 22' is formed on the GaN cap layer 30' and the gate metal 22' is partially patterned so as to provide the drain-side sidewall of the gate electrode 22 and to provide a portion of the gate metal 22' which extends past the source-side sidewall of the gate electrode 22. An etch mask 44 is deposited on the GaN cap layer 30' which partially overlaps the gate metal 22' so as to define the source-side sidewall of the gate electrode 22 and the GaN cap segment 30 and the drain-side sidewall of the GaN cap segment 30.

As illustrated in FIG. 6B, the exposed portion of the GaN cap layer 30' is etched away, leaving one sidewall of the GaN cap segment 30 self-aligned with a sidewall of gate electrode 22 and to expose portions of the AlGaN barrier layer 16. The mask 44 is afterward removed. As illustrated in FIG. 6C, the source electrode 18 and the drain electrode 20 are then formed on the exposed portions of the AlGaN barrier layer 16, and the remainder of the device is processed in a conventional fashion.

While embodiments of the present invention have been described with reference to particular sequences of operations, as will be appreciated by those of skill in the art, certain operations within the sequence may be reordered while still benefiting from the teachings of the present invention. Furthermore, certain operations may be combined into a single operation or separated into multiple operations while still benefiting from the teachings of the present invention. Accordingly, the present invention should not be construed as limited to the exact sequence of operations described herein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a high electron mobility transistor (HEMT), comprising:

forming a first gallium nitride (GaN) layer on a substrate;

forming an aluminum gallium nitride (AlGaN) layer on the first GaN layer;

forming a GaN-based segment on the AlGaN layer, the GaN-based segment having an aluminum concentration of less than the AlGaN layer;

forming a first ohmic contact to the AlGaN layer adjacent and spaced apart from the GaN segment to provide a source electrode;

forming a second ohmic contact to the AlGaN layer adjacent and spaced apart from the GaN segment and opposite first ohmic contact such that the GaN segment is disposed between the first ohmic contact and the second ohmic contact to provide a drain electrode; and forming a non-ohmic contact on the GaN segment to provide a gate contact, the gate contact having a first sidewall which is substantially aligned with the first sidewall of the GaN segment adjacent the source contact and the gate contact extending only a portion of a distance between the first sidewall and a second sidewall of the GaN segment adjacent the second ohmic contact.

2. A method according to claim 1, wherein the non-ohmic contact extends only a portion of a distance between the first sidewall and a second sidewall of the GaN segment adjacent the drain contact.

3. A method according to claim 2, wherein forming a GaN-based segment comprises forming a GaN segment on the AlGaN layer.

4. A method according to claim 3, whereto the forming a GaN segment and forming a non-ohmic contact comprises:
foaming a second GaN layer on the AlGaN layer;
forming a non-ohmic contact on the second GaN layer;
patterning the non-ohmic contact and the second GaN layer to provide the GaN segment and the gate contact.

5. A method according to claim 4, wherein patterning the non-ohmic contact and the second GaN layer comprises:
forming a mask layer on the non-ohmic contact and the second GaN layer so that the mask covers portions of the non-ohmic contact and the second GaN layer so as to define a sidewall of the non-ohmic contact and the GaN segment adjacent the source contact and a sidewall of the GaN segment adjacent the drain contact;
etching the non-ohmic contact and the second GaN layer to expose portions of the AlGaN layer.

6. A method according to claim 3, wherein the GaN segment is formed to a thickness of from about 10 to about 60 Å.

7. A method according to claim 6, wherein the GaN segment comprises undoped GaN.

8. A method according to claim 3, wherein forming a first ohmic contact and forming a second ohmic contact comprises forming a first ohmic contact and a second ohmic contact which arc spaced apart a distance of from about 2 to about 4 $\mu$m.

9. A method according to claim 3, wherein the first ohmic contact is formed a distance of less than about 2 $\mu$m from the GaN segment.

10. A method according to claim 9, wherein the first ohmic contact is formed a distance of from about 0.3 to about 1.5 $\mu$m from the GaN segment.

11. A method according to claim 3, wherein the non-ohmic contact is patterned so that a sidewall of the non-ohmic contact is from about 0.5 to about 1 $\mu$m from the second sidewall of the GaN segment.

12. A method according to claim 3, wherein forming an AlGaN layer comprises forming an AlGaN layer having between about 15% and about 60% aluminum.

13. A method according to claim 12, wherein forming an AlGaN layer comprises forming an AlGaN layer doped with silicon to provide a total sheet concentration of up to about $5 \times 10^{12}$ cm$^{-2}$.

14. A method according to claim 12, wherein forming an AlGaN layer further comprises forming an AlGaN layer to a thickness of from about 15 to about 40 nm.

15. A method according to claim 14, wherein forming an AlGaN layer comprises forming an AlGaN layer to a thickness of about 25 nm.

16. A method according to claim 3, wherein the substrate comprises silicon carbide.

17. A method according to claim 3, wherein the substrate comprises sapphire.

18. A method according to claim 3, wherein the substrate comprises at least one of 4H silicon carbide and 6H silicon carbide.

19. A method according to claim 3, further comprising forming a third GaN layer disposed between the first GaN layer and the substrate.

20. A method according to claim 3, further comprising forming a metallization layer on the non-ohmic contact to provide a T-shaped gate.

* * * * *

UNITED STATES PATENT AND TRADEMARK OFFICE
CERTIFICATE OF CORRECTION

PATENT NO. : 6,777,278 B2
DATED : August 17, 2004
INVENTOR(S) : Smith

It is certified that error appears in the above-identified patent and that said Letters Patent is hereby corrected as shown below:

Title page,
Item [57], ABSTRACT,
Line 6, should read -- contact is provided on the barrier layer to provide a source --

Column 9,
Line 15, should read -- 4. A method according to claim 3, wherein forming a --
Line 39, should read -- contact which are spaced apart a distance of from about 2 to --

Signed and Sealed this

Eighth Day of February, 2005

JON W. DUDAS
*Director of the United States Patent and Trademark Office*